(12) United States Patent
Han et al.

(10) Patent No.: US 9,252,123 B2
(45) Date of Patent: Feb. 2, 2016

(54) MULTI-CHIP PACKAGE AND METHOD OF MANUFACTURING THE SAME

(71) Applicant: Samsung Electronics Co., Ltd., Suwon-si (KR)

(72) Inventors: Won-Gil Han, Asan-si (KR); Se-Yeoul Park, Cheonan-si (KR); Ho-Tae Jin, Cheonan-si (KR); Byong-Joo Kim, Asan-si (KR); Yong-Je Lee, Asan-si (KR); Han-Ki Park, Cheonan-si (KR)

(73) Assignee: SAMSUNG ELECTRONICS CO., LTD., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 14/505,802

(22) Filed: Oct. 3, 2014

(65) Prior Publication Data

US 2015/0031149 A1 Jan. 29, 2015

Related U.S. Application Data

(62) Division of application No. 13/618,357, filed on Sep. 14, 2012, now abandoned.

(30) Foreign Application Priority Data

Oct. 18, 2011 (KR) .......................... 10-2011-0106379

(51) Int. Cl.
*H01L 23/00* (2006.01)
*H01L 21/66* (2006.01)
(Continued)

(52) U.S. Cl.
CPC ................ *H01L 24/85* (2013.01); *H01L 22/14* (2013.01); *H01L 25/0657* (2013.01); *H01L 25/50* (2013.01); *H01L 24/78* (2013.01); *H01L 2224/32145* (2013.01); *H01L 2224/32225* (2013.01); *H01L 2224/48091* (2013.01); *H01L 2224/48145* (2013.01); *H01L 2224/48992* (2013.01); *H01L 2224/73265* (2013.01); *H01L 2224/78301* (2013.01);
(Continued)

(58) Field of Classification Search
CPC ............. H01L 2224/1134; H01L 2225/06513; H01L 2224/32145; H01L 2224/48145; H01L 25/0657

See application file for complete search history.

(56) References Cited

U.S. PATENT DOCUMENTS 5,309,021 A * 5/1994 Shimamoto et al. .......... 257/691
6,176,417 B1 * 1/2001 Tsai et al. .................. 228/180.5
(Continued)

FOREIGN PATENT DOCUMENTS

KR 1020100036064 A 4/2010

*Primary Examiner* — Ha Tran T Nguyen
*Assistant Examiner* — Jordan Klein
(74) *Attorney, Agent, or Firm* — Muir Patent Law, PLLC

(57) ABSTRACT

A multi-chip package may include a first semiconductor chip, a second semiconductor chip, a first stud bump, a first nail head bonding bump, a second stud bump, and a first conductive wire. The first semiconductor chip may have a first bonding pad. The second semiconductor chip may be stacked on the first semiconductor chip so the first bonding pad remains exposed. The second semiconductor chip may have a second bonding pad. The first stud bump may be formed on the first bonding pad. The first nail head bonding bump may be formed on the first stud bump, with one end of a first conductive wire formed between the two. The second stud bump may be formed on the second bonding pad, with another end of the first conductive wire formed between the two. An electrical connection test may be performed on each of the wire bonding processes.

8 Claims, 8 Drawing Sheets

(51) Int. Cl.
 *H01L 25/065* (2006.01)
 *H01L 25/00* (2006.01)

(52) U.S. Cl.
 CPC ............ *H01L 2224/8503* (2013.01); *H01L 2224/85951* (2013.01); *H01L 2224/92247* (2013.01); *H01L 2225/0651* (2013.01); *H01L 2225/06506* (2013.01); *H01L 2225/06568* (2013.01); *H01L 2924/00014* (2013.01); *H01L 2924/15311* (2013.01); *H01L 2924/181* (2013.01); *H01L 2924/35* (2013.01)

(56) References Cited

U.S. PATENT DOCUMENTS

| | | |
|---|---|---|
| 6,215,182 B1 * | 4/2001 | Ozawa et al. ............ 257/723 |
| 6,316,838 B1 * | 11/2001 | Ozawa et al. ............ 257/778 |
| 6,882,056 B2 | 4/2005 | Komiyama et al. |
| 6,921,016 B2 | 7/2005 | Takahashi |
| 7,064,425 B2 | 6/2006 | Takahashi et al. |
| 7,674,653 B2 | 3/2010 | Lai et al. |
| 7,755,175 B2 | 7/2010 | Ishida et al. |
| 7,821,140 B2 | 10/2010 | Mii et al. |
| 2002/0158325 A1 | 10/2002 | Yano et al. |
| 2003/0153124 A1 | 8/2003 | Tomimatsu |
| 2004/0145039 A1 * | 7/2004 | Shim et al. .............. 257/678 |
| 2004/0164128 A1 * | 8/2004 | Mii .......................... 228/180.5 |
| 2005/0200009 A1 * | 9/2005 | Kang et al. .............. 257/734 |
| 2007/0001298 A1 | 1/2007 | Ozawa et al. |
| 2007/0102801 A1 * | 5/2007 | Ishida et al. ............. 257/686 |
| 2009/0321927 A1 * | 12/2009 | Nishimura et al. ........ 257/737 |
| 2010/0035380 A1 | 2/2010 | Li et al. |
| 2010/0187690 A1 * | 7/2010 | Okada et al. ............ 257/738 |
| 2011/0068449 A1 | 3/2011 | Kook |
| 2011/0197438 A1 | 8/2011 | Kikuchii et al. |
| 2012/0068320 A1 * | 3/2012 | Yang et al. ............. 257/676 |
| 2013/0134578 A1 * | 5/2013 | Tan et al. ............... 257/737 |

* cited by examiner

MULTI-CHIP PACKAGE AND METHOD OF MANUFACTURING THE SAME

CROSS-RELATED APPLICATION

This application is a divisional application of and claims priority to U.S. patent application Ser. No. 13/618,357, filed Sep. 14, 2012, which claims priority under 35 USC §119 to Korean Patent Application No. 2011-0106379, filed on Oct. 18, 2011 in the Korean Intellectual Property Office (KIPO), the contents of each of which are herein incorporated by reference in their entirety.

BACKGROUND

Example embodiments relate to a multi-chip package and a method of manufacturing the same. More particularly, example embodiments relate to a multi-chip package including a plurality of semiconductor chips sequentially stacked, and a method of manufacturing the multi-chip package.

SUMMARY

Example embodiments provide a multi-chip package having improved electrical connection reliability between conductive wires, an improved structure on which an electrical connection test of the conductive wires may be performed, and a small size.

In one embodiment, a multi-chip package comprises a package substrate having one or more substrate pads, at least one substrate pad being a ground pad and at least one substrate pad being a signal pad; a first semiconductor chip having at least a first conductive pad; a second semiconductor chip stacked on an upper surface of the first semiconductor chip such that the first conductive pad remains exposed, the second semiconductor chip having at least a second conductive pad; a first stud bump formed on an upper surface of the first conductive pad; a first conductive wire including a first end physically attached to one of the substrate pads and a second end physically attached to an upper surface of the first stud bump; a first nail head bonding bump formed on the first stud bump and the first conductive wire; a second stud bump formed on an upper surface of the second conductive pad; and a second conductive wire including a first end physically attached to the first nail bonding bump and a second end physically attached to an upper surface of the second stud bump.

In one embodiment, a method of manufacturing a multi-chip package comprises providing a package substrate including a plurality of substrate pads disposed on an upper surface of the package substrate, the substrate pads including at least a ground pad and at least a signal pad; stacking a first semiconductor chip on the package substrate, the first semiconductor chip including at least a first bonding pad disposed on an upper surface of the first semiconductor chip; stacking at least a second semiconductor chip on the first semiconductor chip such that the first bonding pad remains exposed, the second semiconductor chip including at least a second bonding pad disposed on an upper surface of the second semiconductor chip; forming a first stud bump on an upper surface of the first bonding pad; forming a first conductive wire to extend from the substrate pad to an upper surface of the first stud bump; forming a first nail head bonding bump on the first stud bump and first conductive wire; and after the first semiconductor chip has been electrically connected to a ground: forming a second stud bump on an upper surface of the second bonding pad; and forming a second conductive wire extending from an upper surface of the first nail head bonding bump to the second stud bump.

In one embodiment, a method of manufacturing a multi-chip package comprises providing a package substrate including a plurality of substrate pads disposed on an upper surface of the package substrate, the substrate pads including at least a ground pad and at least a signal pad; stacking a first semiconductor chip on the package substrate, the first semiconductor chip including at least a first bonding pad disposed on an upper surface of the first semiconductor chip; stacking at least a second semiconductor chip on the first semiconductor chip such that the first bonding pad remains exposed, the second semiconductor chip including at least a second bonding pad disposed on an upper surface of the second semiconductor chip; forming a first electrical connection between the first semiconductor chip and a ground pad on the package substrate, an end of the electrical connection being formed on a first conductive bump of the first semiconductor chip; after electrically connecting the first semiconductor chip to a ground pad, forming a second electrical connection from the first semiconductor chip to the second semiconductor chip, wherein the step of forming a second electrical connection from the first semiconductor chip to the second semiconductor chip comprises the steps of: forming a second conductive bump on the end of the first electrical connection disposed on the first conductive bump of the first semiconductor chip; forming a first conductive bump on the second semiconductor chip; and forming a first conductive wire extending from the second conductive bump of the first semiconductor chip to the first conductive bump on the second semiconductor chip.

BRIEF DESCRIPTION OF THE DRAWINGS

The above and other aspects and features of the disclosure will become apparent by describing in detail exemplary embodiments thereof with reference to the attached drawings, in which.

DETAILED DESCRIPTION OF THE EMBODIMENTS

Figure 1:
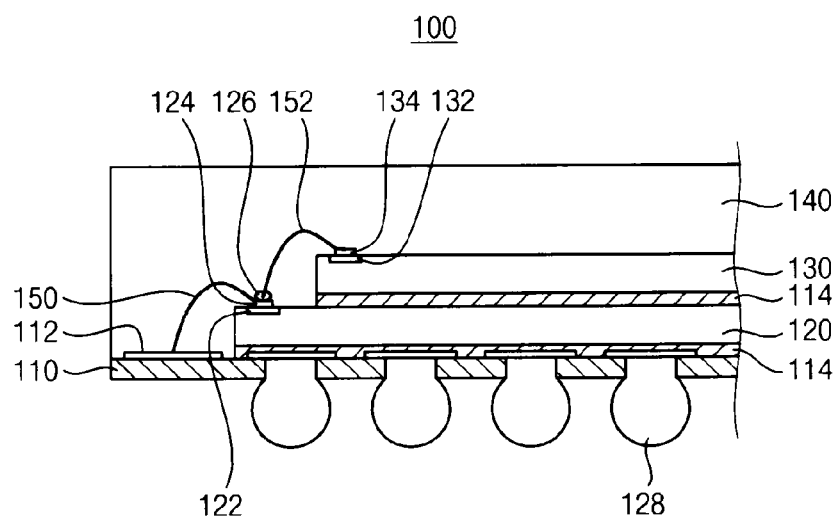
FIG. 1 is a cross-sectional view illustrating a multi-chip package in accordance with example embodiments.

Various example embodiments will now be described more fully hereinafter with reference to the accompanying drawings, in which exemplary embodiments are shown. The present invention may, however, be embodied in many different forms and should not be construed as limited to the example embodiments set forth herein. That is, these example embodiments are just that—examples—and many implementations and variations are possible that do not require the various details herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative size of layers and regions may be exaggerated for clarity. Like numerals refer to like elements throughout.

The terminology used herein is for the purpose of describing particular embodiments only and is not intended to limit the invention. As used herein, the singular terms "a," "an" and "the" should not exclude the plural forms as well, unless the context clearly indicates otherwise. As used herein, the term "and/or" includes any and all combinations of one or more of the associated listed items. It will be understood that when an element or a layer is referred to as being "on," "connected to" or "coupled to" another element or layer, it may be directly on, connected to, or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between;" "adjacent" versus "directly adjacent," etc.).

It will be also understood that although the terms first, second, third etc. may be used herein to describe various elements, components, regions, layers and/or sections, these elements, components, regions, layers, and/or sections should not be limited by these terms. Unless otherwise indicated, these terms are only used to distinguish one element, component, region, layer, or section from another element, components, region, layer, or section. Thus, a first element, components, region, layer, or section in some embodiments could be termed a second element, components, region, layer, or section in other embodiments, and, similarly, a second element, components, region, layer, or section could be termed a first element, components, region, layer, or section without departing from the teachings of the disclosure. Exemplary embodiments explained and illustrated herein may include their complementary counterparts.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the locational descriptors used herein interpreted accordingly.

It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Example embodiments should not be construed as limited to those shown in the views, but include modifications in configuration formed on the basis of, for example, manufacturing processes. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes are not intended to limit the scope of the present disclosure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

Hereinafter, example embodiments will be explained in detail with reference to the accompanying drawings.

Generally, a plurality of semiconductor fabrication processes may be performed on a semiconductor substrate to form a plurality of semiconductor chips. In order to mount the semiconductor chips on a printed circuit board (PCB), a packaging process may be performed on semiconductor chips to form semiconductor packages.

In order to increase a storage capacity of the semiconductor package, a multi-chip package including a plurality of the semiconductor chips sequentially stacked may be widely developed. The stacked semiconductor chips may be electrically connected with each other via conductive wires.

The semiconductor chips of the multi-chip package may have a stair-stepped structure. Each of the stair-stepped semiconductor chips may have an exposed upper edge portion. Bonding pads may be arranged on the exposed upper edge portion of each of the stair-stepped semiconductor chips. The bonding pads may be electrically connected with each other via the conductive wires. The conductive wires may be connected to the bonding pads via conductive bumps such as a stud bump and/or a nail head bonding bump.

When the conductive wire is connected to the bonding pad via only the nail head bonding bump, a conductive wire with a very thin thickness may be directly connected to the nail head bonding bump. This may require a very high accuracy of a wire bonding process. A thin conductive wire may not be accurately or reliably connected to the nail head bonding bump.

When the conductive wire is connected to the bonding pad via the stud bump and the nail head bump, a nail head bonding bump having a large size may be placed on the stud bump having a large size, such that electrical connection reliability between the conductive wire and the bonding pad may be improved. In this scenario, however, according to related wire bonding methods, the conductive wire may extend from a bonding pad of an upper semiconductor chip to a bonding pad of a lower semiconductor chip. A process for electrically connecting a bonding pad of a lowermost semiconductor chip with a ground pad of a package substrate may be performed as one of the last steps of the multi-chip package fabrication. In this case, although an abnormal conductive wire may be generated, the abnormal conductive wire may not be detected before grounding the bonding pad of the lowermost semiconductor chip. With the conventional wire bonding methods for multi-chip packages, before the grounding process, it may not be possible to test electrical connections between the conductive wires.

In the conventional method, the conductive wire may possibly make contact with an edge portion of the semiconductor chip. In order to prevent the contact between the conductive wire and the edge portion of the semiconductor chip, it may be required to enlarge an area of the exposed upper edge portion of the lower semiconductor chip. As a result, the multi-chip package may have a wide width.

Figure 2:
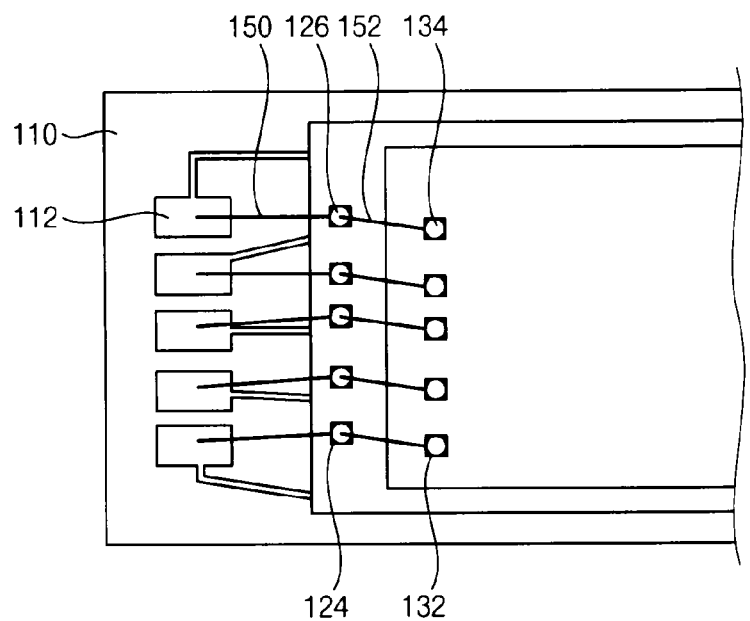
FIG. 2 is an exemplary plan view illustrating the multi-chip package in FIG. 1.
Figure 3:
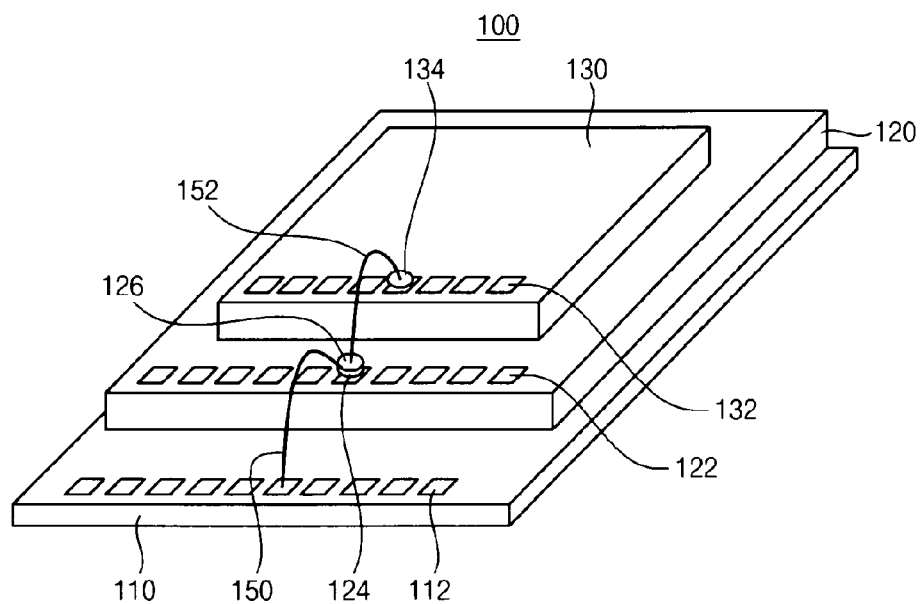
FIG. 3 is an exemplary perspective view illustrating a package substrate, a first semiconductor chip and a second semiconductor chip of the multi-chip package in FIG. 1.

FIG. 1 is a cross-sectional view illustrating a multi-chip package in accordance with example embodiments, FIG. 2 is a plan view illustrating the exemplary multi-chip package in FIG. 1, and FIG. 3 is a perspective view illustrating a package substrate, a first semiconductor chip and a second semiconductor chip of the exemplary multi-chip package in FIG. 1.

Referring to FIGS. 1 to 3, a multi-chip package 100 of this example embodiment may include a package substrate 110, a first semiconductor chip 120, a second semiconductor chip 130, a first stud bump 124, a first nail head bonding bump 126, a second stud bump 134, a substrate wire 150, a first conductive wire 152, a molding member 140 and external terminals 128.

The package substrate 110 may have substrate pads 112. In example embodiments, the substrate pads 112 may be arranged at an upper surface of the package substrate 110. In some embodiments, some or all of the substrate pads 112 are arranged on an edge of the upper surface of the package substrate 110. The substrate pads 112 may include at least one signal pad and at least one ground pad. The substrate pads 112 may be any conductive pad or terminal disposed on the upper surface of the package substrate 110, through which signals and/or power may be transmitted.

The first semiconductor chip 120 may be disposed on an upper surface of the package substrate 110. In example embodiments, the first semiconductor chip 120 may be attached to the upper surface of the package substrate 110 using an adhesive 114. The first semiconductor chip 120 may be positioned on the upper surface of the package substrate 110 such that the substrate pads 112 remain exposed. The first semiconductor chip 120 may include a plurality of first bonding pads 122. The first bonding pads 122 may be disposed on an edge portion of an upper surface of the first semiconductor chip 120. The first bonding pads 122 may be any conductive pad or terminal disposed on the upper surface of the first semiconductor chip 120 through which signals and/or power may be transmitted.

The second semiconductor chip 130 may be disposed on the upper surface of the first semiconductor chip 120. In example embodiments, the second semiconductor chip 130 may be attached to the upper surface of the first semiconductor chip 120 using the adhesive 114. The second semiconductor chip 130 may be positioned on the upper surface of the first semiconductor chip 120 such that the first bonding pads 122 remain exposed. The package substrate 110, the first semiconductor chip 120 and the second semiconductor chip 130 may have a stepped or stair structure. The second semiconductor chip 130 may include a plurality of second bonding pads 132. The second bonding pads 132 may be disposed on an edge portion of an upper surface of the second semiconductor chip 130. The second bonding pads 132 may be any conductive pad or terminal disposed on the upper surface of the second semiconductor chip 130 through which signals and/or power may be transmitted.

The first stud bumps 124 may be formed on the first bonding pads 122. In example embodiments, the first stud bump 124 may be formed by applying a spark to an end of a metal line (not shown) drawn from a capillary (not shown) that may be used for forming the substrate wire 150 and the first conductive wire 152. In some embodiments, the first stud bump 124, the substrate wire 150 and the first conductive wire 152 may include the same material. The first stud bumps 124 may be conductive connectors formed in the manner described above, and through which signals and/or power may be transmitted. For example, the first stud bumps 124 may be conductive bumps, conductive balls, etc.

The substrate wire 150 may be a conductive connector that electrically connects the substrate pad 112 and the first stud bump 124. For example, the substrate wire 150 may be extended from the substrate pad 112 to an upper end of the first stud bump 124. The first semiconductor chip 120 and the package substrate 110 may be electrically connected with each other, such that signals may be passed and/or logical communication may occur between the two, via the first stud bump 124 and the substrate wire 150. The substrate wire 150 may be physically connected to a top surface of the first stud bump 124. The substrate wire 150 may be, for example, welded to the top surface of the first stud bump 124. In other embodiments, heat may be applied to the metal line (not shown) from which the substrate wire is formed, at a point where the metal line contacts a top surface of the first stud bump 124, thereby forming a physical connection between the substrate wire 150 and the first stud bump 124. In some embodiments, the surface area of the first stud bump 124 that is in contact with the first bonding pad 122 may be at least half as large as the surface area of the upper surface of the first bonding pad 122. In some embodiments, the surface area of the first stud bump 124 in contact with the first bonding pad 122 may be the same size as the surface area of the upper surface of the first bonding pad 122.

In example embodiments, the substrate wire 150 may also be electrically connected to the ground pad of the substrate pads 112. Correspondingly, the first semiconductor chip 120 may be connected to the ground pad. In these embodiments, it may be possible to perform an electrical connection test between the first semiconductor chip 120 and the package substrate 110.

The first nail head bonding bump 126 may be formed on the first stud bump 124. As mentioned above, the substrate wire 150 may be disposed on a top surface of the first stud bump 124, such that the substrate wire 150 may be interposed between the first stud bump 124 and the first nail head bonding bump 126. In example embodiments, the first nail head bonding bump 126 may be formed by applying a spark to an end of the metal line (not shown) drawn from the capillary (not shown). The first nail head bonding bump 126 may include a material the same as that of the first stud bump 124, the substrate wire 150 and the first conductive wire 152. The first nail head bonding bump 126 may be a conductive connector formed in the manner described above, and through which signals and/or power may be transmitted. For example, the first nail head bonding bump 126 may be conductive bumps, conductive balls, etc.

In some embodiments, the surface area of a lower surface of the first nail head bonding bump 126 that faces an upper surface of the first stud bump 124 may be twice as large as the surface area of the upper surface of the first stud bump 124. In some embodiments, the surface area of a lower surface of the first nail head bonding bump 126 that faces an upper surface of first stud bump 124 may be the same size as the surface area of the upper surface of the first stud bump 124.

In example embodiments, the electrical connection between the first semiconductor chip 120 and the second semiconductor chip 130 may be enhanced due to increased contact between the first nail head bonding bump 126 and the first stud bump 124. The first nail head bonding bump 126 and the first stud bump 126 may have cross-sectional areas overlapping each other larger than those of the substrate wire 150 and the first conductive wire 152. The electrical connection between the first semiconductor chip 120 and the second semiconductor chip 130 may have improved reliability with the use of the nail head bonding bump 126 and the first stud bump 126 in the example configurations.

The second stud bump 134 may be formed on the second bonding pad 132. In example embodiments, the second stud bump 134 may be formed by applying a spark to an end of the metal line drawn from the capillary. The second stud bump 134 may be similar to the first stud bump 124. For example, the second stud bump 134 may be of one of the same types as the first stud bump 124 and may be made of similar or the same material.

The first conductive wire 152 may a conductive wire that may electrically connects the first nail head bonding bump 126 and the second stud bump 134. In some embodiments, the first conductive wire 152 may extend from the upper end of the first nail head bonding bump 126 to an upper end of the second stud bump 134. Correspondingly, the second semiconductor chip 130 may be connected with the ground pad via the first conductive wire 152 and the substrate wire 150. In these embodiments, it may be possible to perform an electrical connection test between the first semiconductor chip 120 and the second semiconductor chip 130. The first conductive wire 152 may be similar to the substrate wire 150. For example, the first conductive wire 152 may be made of the same or similar material as the substrate wire 150.

In example embodiments, the first conductive wire 152 may be connected to the upper end of the first nail head bonding bump 126, and not to a side surface of the first nail head bonding bump 126. In these examples, the likelihood of contact between the first conductive wire 152 and an upper end of a side surface of the second semiconductor chip 130 is minimal and may be prevented. The end of the first conductive wire 152 connected to the first nail head bonding bump 126 is elevated as compared to being connected merely to a pad or terminal on the first semiconductor chip 120. Given the increased elevation of the end of the first conductive wire 152 connected to the first semiconductor chip, the space between the first nail head bonding bump 126 and a vertical surface of the second semiconductor chip 130 contacting the first semiconductor chip 120 may be reduced. In some embodiments, the width of space between the first bonding pad 122 of the first semiconductor chip 120 and the vertical side surface of the second semiconductor chip 130 may be the same as a half of a width of the capillary. Because the first conductive wire 152 is physically connected to a top of the first nail head bonding bump 126 and not to a side surface thereof, the amount of the space between the first bonding pad 122 and a vertical side surface of the second semiconductor chip 130 may be set regardless of the width of the first conductive wire 152. In these embodiments, a portion of the first semiconductor chip 120 extending past the second semiconductor chip 130 in a step or stair fashion may have a narrow width. Correspondingly, the multi-chip package 100 may also have a narrow width.

The molding member 140 may be formed on the upper surface of the package substrate 110 to cover the first semiconductor chip 120, the second semiconductor chip 130, the substrate wire 150 and the first conductive wire 152. The molding member 140 may protect the first semiconductor chip 120, the second semiconductor chip 130, the substrate wire 150 and the first conductive wire 152 from external environments. In example embodiments, the molding member 140 may include an epoxy molding compound (EMC) or may be any other suitable material (e.g. any insulative, non-conductive material).

The external terminals 128 may be mounted on a lower surface of the package substrate 110. The external terminals 128 may be electrically connected to the substrate pads 112. In example embodiments, the external terminals 128 may include conductive connectors such as solder balls, conductive plugs, conductive leads, and so forth.

FIGS. 4 to 8 are cross-sectional views illustrating an exemplary method of manufacturing the multi-chip package in FIG. 1.

Figure 4:
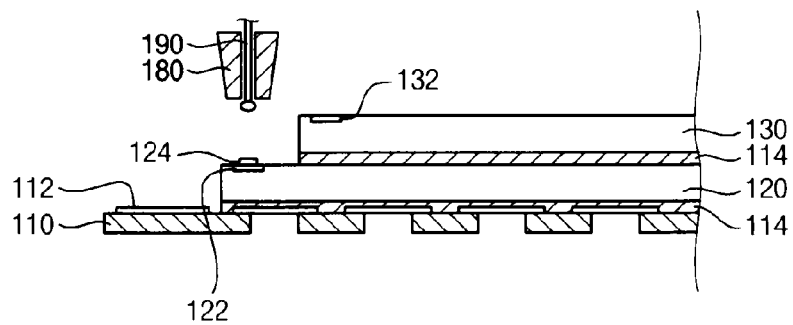
FIGS. 4 to 8 are cross-sectional views illustrating an exemplary method of manufacturing the multi-chip package in FIG. 1.

Referring to FIG. 4, the first semiconductor chip 120 may be attached to the upper surface of the package substrate 110 using the adhesive 114. The first semiconductor chip 120 may be disposed on the upper surface of the package substrate 110 such that the substrate pad 112 of the package substrate 110 may remain exposed and not covered or rendered unusable by the first semiconductor chip 120.

The second semiconductor chip 130 may be attached to the upper surface of the first semiconductor chip 120 using the adhesive 114. The second semiconductor chip 130 may be disposed on the upper surface of the first semiconductor chip 120 such that the first bonding pad 122 of the first semiconductor chip 120 remains exposed and not covered or rendered unusable by the second semiconductor chip 130.

The capillary 180 may be positioned over the first bonding pad 122. A metal line 190 may be drawn through a hole of the capillary 180. For example, the capillary 180 may be a needle-like tool through which a metal line 190 is drawn. The metal line 190 may extend past a first end of the capillary 180 and may be contained in a spool like structure past that first end of the capillary 180. A small length of the metal line 190 may extend past the other end (the second end) of the capillary 180 and may be used to form structures or enable the forming of structures of the multi-chip package 100. A spark may be applied to the end of the metal line 190 extending past the capillary 180 to form the first stud bump 124. In some embodiments, a spark may be a high voltage electric charge that is applied to the metal line 190 that melts the metal line 190 at the tip of the capillary 180 to form the first stud bump 124. The first stud bump 124 may be shaped like a ball due to the surface tension of the molten metal of the metal line 190.

The first stud bump 124 may be disposed on a top surface of the first bonding pad 122. A supersonic wave may be applied to the first stud bump 124 to bond the first stud bump 124 to the first bonding pad 122. For example, the capillary 180 may be lowered to be positioned at a top surface of the first stud bump 124. The first semiconductor chip 120 may be heated to at least 125 degrees Celsius. The capillary 180 may apply ultra sonic energy, such as a supersonic wave, to the first stud bump 124. The combined heat, pressure, and supersonic energy may create a weld between the first stud bump 124 and the first bonding pad 122. After the first stud bump 124 has been bonded to the first bonding pad 122, the metal line 190 may then be cut to separate the first stud bump 124 from the metal line 190.

Figure 5:
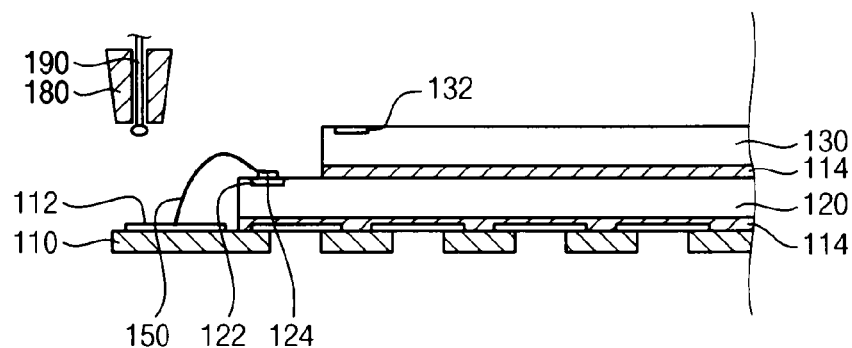

Referring to FIG. 5, the capillary 180 may be positioned at a top of the substrate pad 112. A first end of the metal line 190 may be bonded to the substrate pad 112. For example, heat or a spark may be applied to melt a small portion of the metal line 190 to the substrate pad 112. The capillary 180 may then be positioned at a top of the first stud bump 124, with one end of the metal line physically connected to the substrate pad 112 such that a length of metal line from the substrate pad 112 to the top of the first stud bump 124 extends past one end of the capillary 190. The metal line 190 may be physically connected at the upper end of the first stud bump 124, such that a portion of the metal line 190 physically connects the substrate pad 112 and the first stud bump 124. For example, a spark may be applied to the metal line 190 at the upper surface of the first stud bump 124 to physically connect the metal line 190 to the first stud bump 124, thereby forming the substrate wire 150 between the substrate pad 112 and the first stud bump 124. The metal line 190 may then be separated from the substrate wire 150.

As mentioned above, in example embodiments, the substrate pad 112 may include one or more signal pads and one or more ground pads. Correspondingly, the first semiconductor chip 120 may be connected with the ground pad through the substrate wire 150. In these embodiments, it may be possible to perform the electrical connection test between the first semiconductor chip 120 and the package substrate 110.

Figure 6:
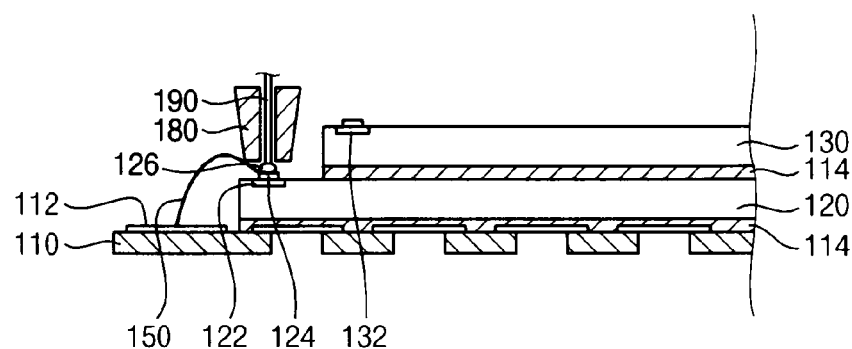

Referring to FIG. 6, a spark may be applied to a lower end of the metal line 190 to form the first nail head bonding bump 126. The capillary 180 may then be descended toward the first stud bump 124 to bond the first nail head bonding bump 126 to the first stud bump 124. The metal line 190 may then be separated from the first nail head bonding bump 126. The first nail head bonding bump 126 may be formed in a manner similar to the forming of the first stud bump 124. The first nail head bonding bump 126 may be bonded to the first stud bump 124 in a manner similar to the bonding of the first stud bump 124 to the first bonding pad 122.

Figure 7:
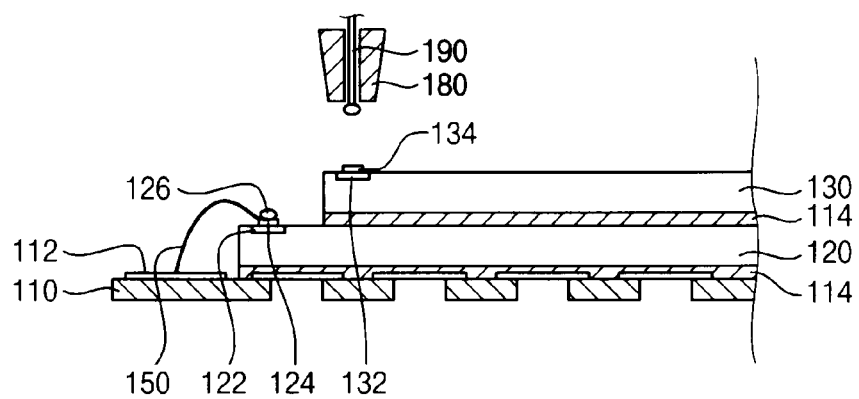

Referring to FIG. 7, a spark may be applied to a lower end of the metal line 190 to form the second stud bump 134. The second stud bump 134 may be disposed on the second bonding pad 132. A supersonic wave may be applied to the second stud bump 134 to bond the second stud bump 134 to the second bonding pad 132. The metal line 190 may then be separated from the second stud bump 134. The second stud bump 134 may be formed in a manner similar to the forming of the first stud bump 124. The second stud bump 134 may be bonded to the second bonding pad 132 in a manner similar to the bonding of the first stud bump 124 to the first bonding pad 122.

Figure 8:
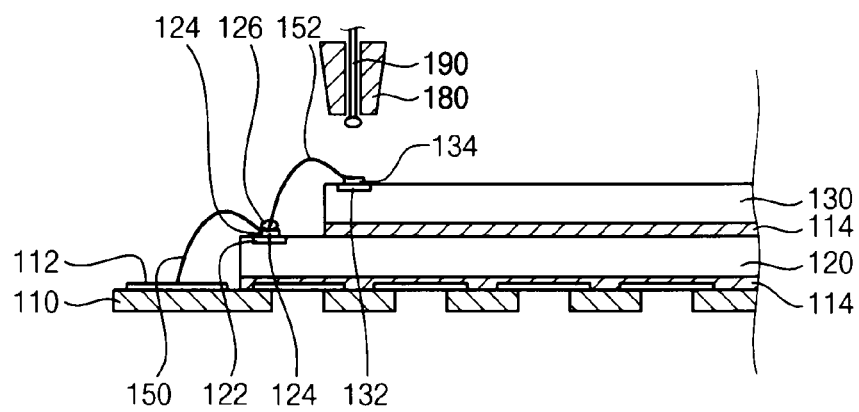

Referring to FIG. 8, the metal line 190 may be extended, via the capillary 180, from the first nail head bonding bump 126 to the second stud bump 134 to form the first conductive wire 152 between first nail head bonding bump 126 and the second stud bump 134. The metal line 190 may then be separated from the first conductive wire 152. The first conductive wire 152 may be formed and connected to the first nail head bonding bump 126 and the second stud bump 134 in a manner similar to the forming and connection of the substrate wire 150.

In example embodiments, the second semiconductor chip 130 may be connected with the ground pad via the first conductive wire 152 and the substrate wire 150. In these embodiments, it may be possible to perform the electrical connection test between the first semiconductor chip 120 and the second semiconductor chip 130.

As mentioned above, in example embodiments, the first conductive wire 152 may be connected to the upper end of the first nail head bonding bump 126, not to a side surface of the first nail head bonding bump 126. In these examples, the likelihood of contact between the first conductive wire 152 and an upper end of a side surface of the second semiconductor chip 130 is minimal and may be prevented. Also, the space between the first nail head bonding bump 126 and an vertical surface of the second semiconductor chip 130 contacting the first semiconductor chip 120 may be reduced. In some embodiments, the width of space between the first bonding pad 122 of the first semiconductor chip 120 and the vertical side surface of the second semiconductor chip 130 may be the same as a half of a width of the capillary. As mentioned above, the amount of the space between the first bonding pad 122 and a vertical side surface of the second semiconductor chip 130 may be set regardless of the width of the first conductive wire 152. In these embodiments, a portion of the first semiconductor chip 120 extending past the second semiconductor chip 130 in a step or stair fashion may have a narrow width. Correspondingly, the multi-chip package 100 may also have a narrow width.

The molding member 140 may be formed on the upper surface of the package substrate 110 to cover the first semiconductor chip 120, the second semiconductor chip 130, the substrate wire 150 and the first conductive wire 152.

The external terminals 128 may be mounted on the lower surface of the package substrate 110 to complete the multi-chip package 100 in FIG. 1.

Figure 9:
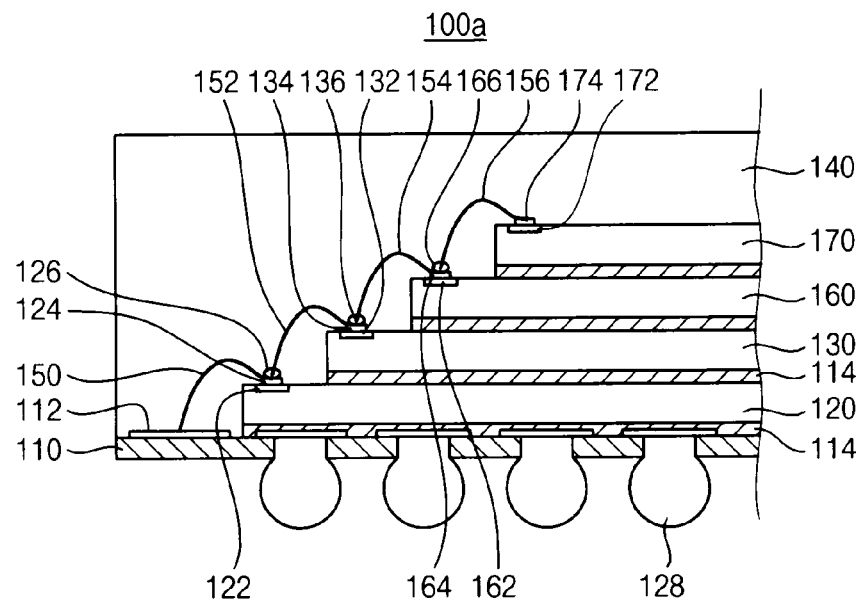
FIG. 9 is a cross-sectional view illustrating a multi-chip package in accordance with example embodiments.

FIG. 9 is a cross-sectional view illustrating a multi-chip package in accordance with example embodiments.

A multi-chip package 100a of this example embodiment may include elements similar to or the same as those of the multi-chip package 100 in FIG. 1 except for further including a third semiconductor chip 160, a fourth semiconductor chip 170, a second conductive wire 154 and a third conductive wire 156. Thus, the same reference numerals may refer to the same elements and any further illustrations with respect to the same elements may be omitted herein for brevity.

Referring to FIG. 9, the third semiconductor chip 160 may be attached to the upper surface of the second semiconductor chip 130 using the adhesive 114. The third semiconductor chip 160 may be disposed on the upper surface of the second semiconductor chip 130 such that the second bonding pad 122 of the second semiconductor chip 130 may remain exposed and not covered or rendered unusable by the third semiconductor chip 160.

The fourth semiconductor chip 170 may be attached to the upper surface of the third semiconductor chip 160 using the adhesive 114. The fourth semiconductor chip 170 may be disposed on the upper surface of the third semiconductor chip 160 such that the third bonding pad 132 of the third semiconductor chip 160 remains exposed and not covered or rendered unusable by the fourth semiconductor chip 170.

A second nail head bonding bump 136 may be formed on the second stud bump 134. One end of the first conductive wire 152 may be disposed on a top surface of the second stud bump 134, such that the first conductive wire 152 may be interposed between the second stud bump 134 and the second nail head bonding bump 136. The second nail head bonding bump 136 may be similar to the first nail head bonding bump 126. For example, the second nail head bonding bump 136 may be formed in a manner similar to the forming of the first nail head bonding bump 126 or may be of the same or similar materials as the first nail head bonding bump 126.

A third stud bump 164 may be formed on the third bonding pads 162. The third stud bump 164 may be similar to the second stud bump 134. For example, the third stud bump 164 may be formed in a manner similar to the forming of the second stud bump 134 or may be of the same or similar materials as the second stud bump 134. A second conductive wire 154 may electrically connect between the second nail head bonding bump 136 and the third stud bump 164, such that signals and logical communications may be transmitted via the second conductive wire 154 to the second nail head bonding bump 136 and the third stud bump 164. The second conductive wire 154 may be similar to the first conductive wire 152. For example, the second conductive wire 154 may be formed in a manner similar to the forming of the first conductive wire 152 or may be of the same or similar materials as the first conductive wire 152.

A third nail head bonding bump 166 may be formed on the third stud bump 164. One end of the second conductive wire 154 may be disposed on a top surface of the third stud bump 164, such that the second conductive wire 154 may be interposed between the third stud bump 164 and the third nail head bonding bump 166. The third nail head bonding bump 166 may be similar to the second nail head bonding bump 136. For example, the third nail head bonding bump 166 may be formed in a manner similar to the forming of the second nail head bonding bump 136 or may be of the same or similar materials as the second nail head bonding bump 136.

A fourth stud bump 174 may be formed on the fourth bonding pad 172. The fourth stud bump 174 may be similar to the third stud bump 164. For example, the fourth stud bump 174 may be formed in a manner similar to the forming of the third stud bump 164 or may be of the same or similar materials as the third stud bump 164. A third conductive wire 156 may electrically connect between the third nail head bonding bump 166 and the fourth stud bump 174, such that signals and logical communications may be transmitted via the third conductive wire 156 to the third nail head bonding bump 166 and the fourth stud bump 174. The third conductive wire 156 may be similar to the second conductive wire 1524. For example, the third conductive wire 156 may be formed in a manner similar to the forming of the second conductive wire 154 or may be of the same or similar materials as the second conductive wire 154.

FIGS. 10 to 15 are cross-sectional views illustrating a method of manufacturing the multi-chip package in FIG. 9.

Processes similar or the same as those illustrated with reference to FIGS. 4 to 8 may be performed to electrically connect the first semiconductor chip 120 and the second semiconductor chip 130 using the first conductive wire 152.

Figure 10:
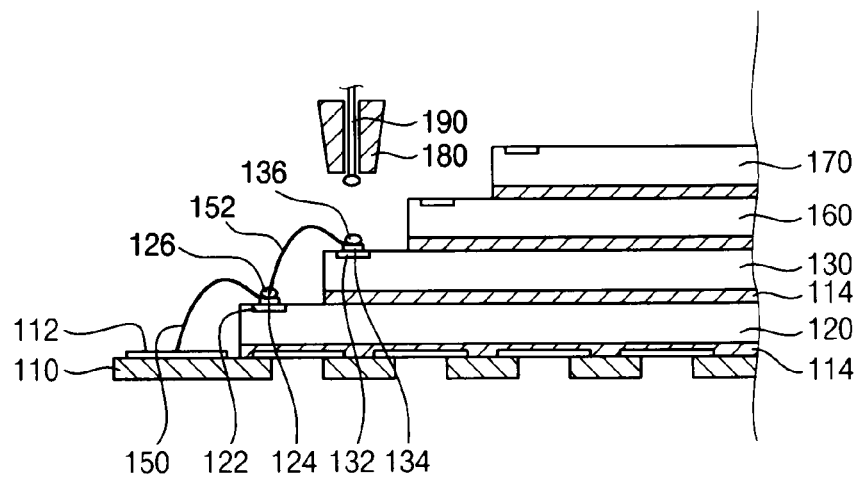
FIGS. 10 to 15 are cross-sectional views illustrating an exemplary method of manufacturing the multi-chip package in FIG. 9.

Referring to FIG. 10, the third semiconductor chip 160 may be attached to the upper surface of the second semiconductor chip 130 using the adhesive 114. The third semiconductor chip 160 may be disposed on the upper surface of the second semiconductor chip 130 such that the second bonding pad 122 of the second semiconductor chip 130 may remain exposed and not covered or rendered unusable by the third semiconductor chip 160.

The fourth semiconductor chip 170 may be attached to the upper surface of the third semiconductor chip 160 using the adhesive 114. The fourth semiconductor chip 170 may be disposed on the upper surface of the third semiconductor chip 160 such that the third bonding pad 132 of the third semiconductor chip 160 may remain exposed and not covered or rendered unusable by the fourth semiconductor chip 170.

A spark may be applied to a lower end of the metal line 190 to form the second nail head bonding bump 136. The second nail head bonding bump 136 may be bonded to the second stud bump 134. The metal line 190 may then be separated from the second nail head bonding bump 136. The process of forming the second nail head bonding bump 136 may be similar to the process of forming the first nail head bonding bump 126. The process of bonding the second nail head bonding bump 136 to the second stud bump 134 may be the same or similar to the process of bonding the first nail head bonding bump 126 to the first stud bump 124.

Figure 11:
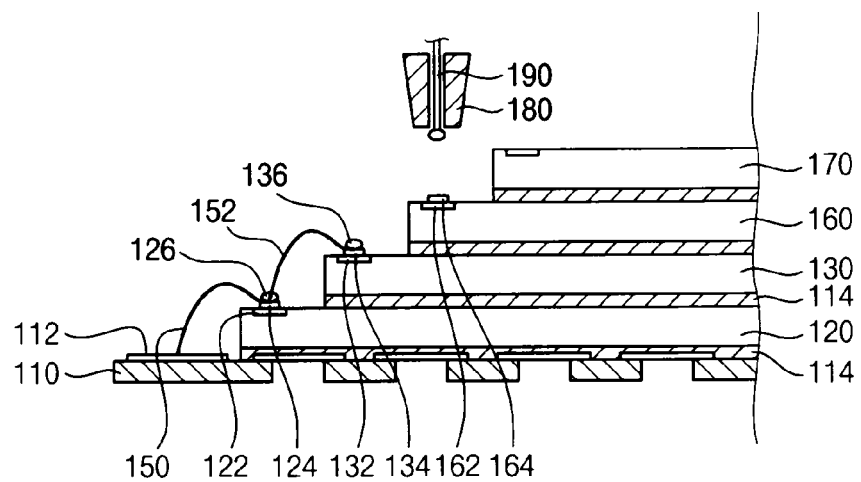

Referring to FIG. 11, a spark may be applied to a lower end of the metal line 190 to form the third stud bump 164. The third stud bump 164 may be placed on the third bonding pad 162. A supersonic wave may be applied to the third stud bump 164 to bond the third stud bump 164 to the third bonding pad 162. The metal line 190 may be cut to separate the metal line 190 from the third stud bump 164. The process of forming the third stud bump 164 may be the same or similar to the process of forming the first stud bump 124. The process of bonding the third stud bump 164 to the third bonding pad 162 may be the same or similar to the process of bonding the first stud bump 124 to the first bonding pad 122.

Figure 12:
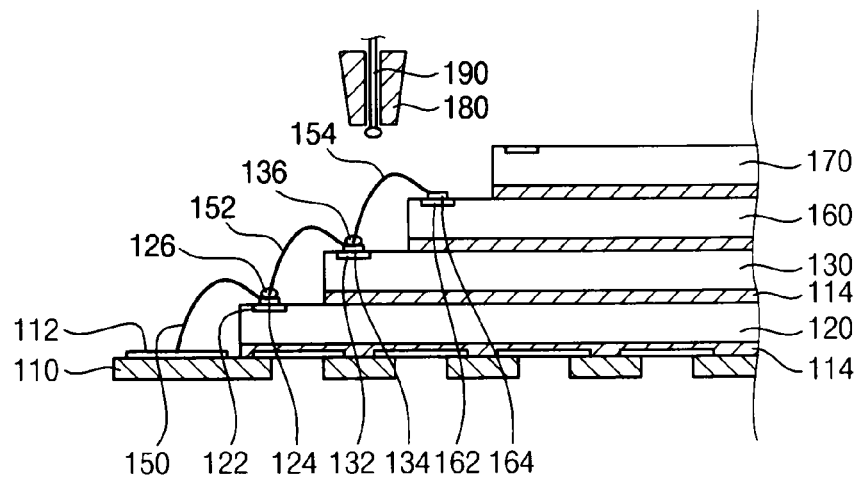

Referring to FIG. 12, a lower end of the metal line 190 may be extended from the second nail head bonding bump 136 to the third stud bump 164 to form the second conductive wire 154 between the second nail head bonding bump 136 and the third stud bump 164. The metal line 190 may then be separated from the second conductive wire 154. The process of forming the second conductive wire 154 may be the same or similar to the process of forming the first conductive wire 152.

Figure 13:
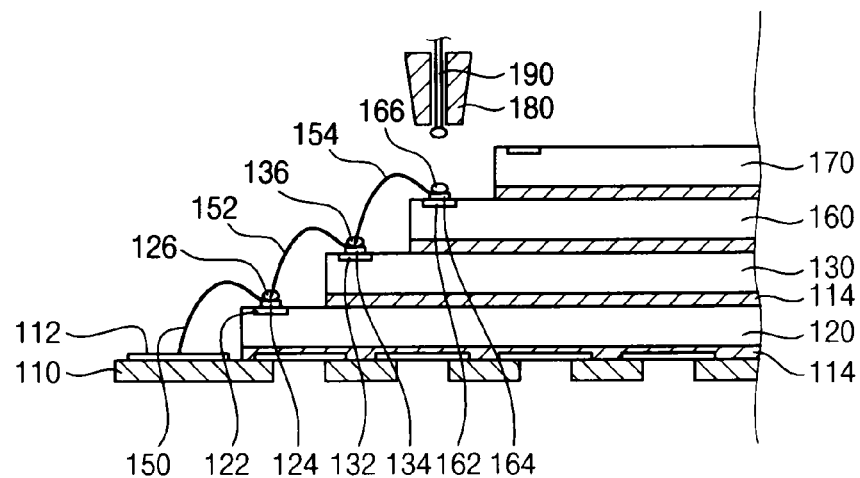

Referring to FIG. 13, a spark may be applied to a lower end of the metal line 190 to form the third nail head bonding bump 166. The third nail head bonding bump 166 may be bonded to the third stud bump 164. The metal line 190 may then be separated from the third nail head bonding bump 166. The process of forming the third nail head bonding bump 166 may be the same or similar to the process of forming the first nail head bonding bump 126. The process of bonding the third nail head bonding bump 166 to the third stud bump 164 maybe the same or similar to the process of bonding the first nail head bonding bump 126 to the first stud bump 124.

Figure 14:
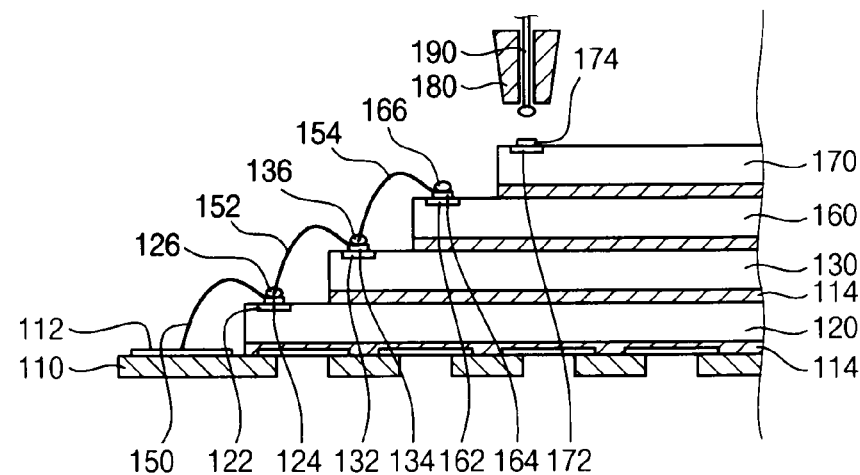

Referring to FIG. 14, a spark may be applied to a lower end of the metal line 190 to form the fourth stud bump 174. The fourth stud bump 174 may be placed on the fourth bonding pad 172. A supersonic wave may be applied to the fourth stud bump 174 to bond the fourth stud bump 174 to the fourth bonding pad 172. The metal line 190 may then be separated from the second stud bump 174. The process of forming the fourth stud bump 764 may be the same or similar to the process of forming the first stud bump 124. The process of bonding the fourth stud bump 174 to the fourth bonding pad 172 may be the same or similar to the process of bonding the first stud bump 124 to the first bonding pad 122.

Figure 15:
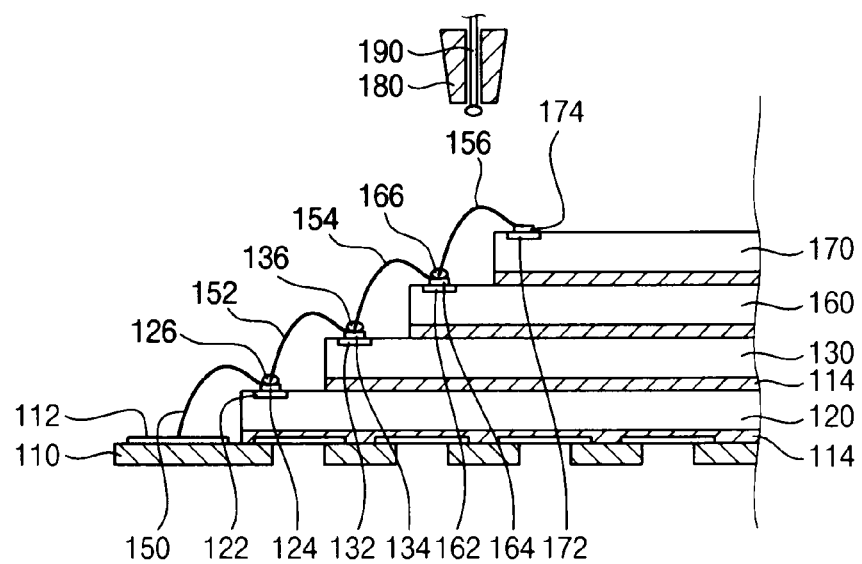

Referring to FIG. 15, the metal line 190 may be extended from the third nail head bonding bump 166 to the fourth stud bump 174 to form the third conductive wire 156 between the third nail head bonding bump 166 and the fourth stud bump 174. The metal line 190 may then be separated from the third conductive wire 156. The process of forming the third conductive wire 156 may be the same or similar to the process of forming the first conductive wire 152.

The molding member 140 may be formed on the package substrate 110 to cover the first semiconductor chip 120, the second semiconductor chip 130, the third semiconductor chip 160 and the fourth semiconductor chip 170.

The external terminals 128 may be mounted on the lower surface of the package substrate 110 to complete the multi-chip package 100a in FIG. 9.

In example embodiments, the multi-chip package may include the two semiconductor chips or the four semiconductor chips. Alternatively, the multi-chip package may further include three semiconductor chips, at least five semiconductor chips, etc. The multi-chip package described herein may include a plurality of semiconductor chips stacked in a stepped or staired manner at least at one end of the package. One or more of the semiconductor chips of the multi-chip package may be a memory chip, and one or more of the semiconductor chips may be a logic chip, may act as a processor, etc. The multi-chip package could be part of a device such as personal data assistant (PDA), smart phone, camera, LCD, computer laptop, memory card, etc.

According to example embodiments, after the semiconductor chip is grounded to the package substrate, the wire bonding processes may be performed from a lowermost semiconductor chip to an uppermost semiconductor chip. An electrical connection test between the conductive wires may be performed for each of the wire bonding processes, for example, after a first chip is connected to a substrate via a wire bonding, but before the first chip is connected to a second chip via wire bonding. In these example embodiments, the nail head bonding bump may be formed on the stud bump, so that the conductive wires may have improved electrical connection reliability. In these example embodiments, the conductive wire may be connected to the upper end of the nail head bonding bump, so that the conductive wire may not make contact with an edge portion of the semiconductor chip. Correspondingly, a narrow gap may be provided between the nail head bonding bump and the edge portion of the semiconductor chip may be narrow, so that the multi-chip package may have a small size.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A method of manufacturing a multi-chip package, the method comprising:
   providing a package substrate including a plurality of substrate pads disposed on an upper surface of the package substrate, the substrate pads including at least a ground pad and at least a signal pad;
   stacking a first semiconductor chip on the package substrate, the first semiconductor chip including at least a first bonding pad disposed on an upper surface of the first semiconductor chip;
   stacking at least a second semiconductor chip on the first semiconductor chip such that the first bonding pad remains exposed, the second semiconductor chip including at least a second bonding pad disposed on an upper surface of the second semiconductor chip;
   forming a first stud bump on an upper surface of the first bonding pad;
   forming a first conductive wire to extend from a first ground pad of the plurality of substrate pads to an upper surface of the first stud bump;
   forming a first nail head bonding bump on the first stud bump and first conductive wire; and
   after the first semiconductor chip has been electrically connected to the first ground pad:
   forming a second stud bump on an upper surface of the second bonding pad;
   forming a second conductive wire extending from an upper surface of the first nail head bonding bump to the second stud bump; and
   testing an electrical connectivity of the first semiconductor chip, wherein the step of testing is perform after forming the first conductive wire and before forming the second stud bump.

2. The method of claim 1, further comprising:
   after forming the second conductive wire, forming a second nail head bonding bump on the second stud bump and second conductive wire.

3. The method of claim 1, wherein the first stud bump, first conductive wire, and first nail head are formed from a same metal line.

4. The method of claim 1, wherein a surface area of the first stud bump in contact with the first bonding pad is at least 50% the size of the surface area of the upper surface of the first bonding pad.

5. The method of claim 4, wherein a surface area of a lower surface of the first nail head bonding bump that faces the upper surface of the first stud bump is at least 50% of the size of the surface area of the upper surface of the first stud bump.

6. A method of manufacturing a multi-chip package, comprising:
   providing a package substrate including a plurality of substrate pads disposed on an upper surface of the package substrate, the substrate pads including at least a ground pad and at least a signal pad;
   stacking a first semiconductor chip on the package substrate, the first semiconductor chip including at least a first bonding pad disposed on an upper surface of the first semiconductor chip;
   stacking at least a second semiconductor chip on the first semiconductor chip such that the first bonding pad remains exposed, the second semiconductor chip including at least a second bonding pad disposed on an upper surface of the second semiconductor chip;
   forming a first electrical connection between the first semiconductor chip and a ground pad on the package substrate, an end of the electrical connection being formed on a first conductive bump of the first semiconductor chip; and
   after electrically connecting the first semiconductor chip to the ground pad, forming a second electrical connection from the first semiconductor chip to the second semiconductor chip,
   wherein the step of forming a second electrical connection from the first semiconductor chip to the second semiconductor chip comprises the steps of:
   forming a second conductive bump on the end of the first electrical connection disposed on the first conductive bump of the first semiconductor chip;
   forming a first conductive bump on the second semiconductor chip; and
   forming a first conductive wire extending from the second conductive bump of the first semiconductor chip to the first conductive bump on the second semiconductor chip; and
   testing an electrical connectivity of the first semiconductor chip, wherein the step of testing is performed after forming the first electrical connection and before forming the first conductive bump on the second semiconductor chip.

7. The method of claim 6, wherein:
forming the first conductive bump on the first semiconductor chip comprises forming a first stud bump on an upper surface of the first bonding pad;
forming the second conductive bump on an end of the of the first electrical connection comprises forming a first nail head bonding bump on the first stud bump and first electrical connection;
forming a first conductive bump on the second semiconductor chip comprises forming a second stud bump on an upper surface of the second bonding pad.

8. The method of claim 6, further comprising:
stacking a third semiconductor chip on the second semiconductor chip such that the second bonding pad remains exposed, the third semiconductor chip including at least a third bonding pad disposed on an upper surface of the third semiconductor chip;
electrically connecting the third semiconductor chip and the second semiconductor chip,
wherein the step of stacking the third semiconductor chip is performed before the step of electrically connecting the first semiconductor chip and the second semiconductor chip, and
wherein the step of electrically connecting the third semiconductor chip and the second semiconductor chip is performed after the step of electrically connecting the first semiconductor chip and the second semiconductor chip.

* * * * *